United States Patent
Garcia et al.

[19]

[11] Patent Number: 6,070,284
[45] Date of Patent: Jun. 6, 2000

[54] WAFER CLEANING METHOD AND SYSTEM

[75] Inventors: Alejandro Garcia, Union City; Brent Krick, Mountain View, both of Calif.; Anthony Nichtawitz, Lima, Peru; Daniel Nordeen, Boulder Creek, Calif.; Josh Oen, Fremont, Calif.; Kenneth Smith, Cupertino, Calif.; Vincent Suro, Sunnyvale, Calif.; Daniel Wolf, San Jose, Calif.

[73] Assignee: Silikinetic Technology, Inc., Fremont, Calif.

[21] Appl. No.: 09/113,703

[22] Filed: Jul. 10, 1998

Related U.S. Application Data

[60] Provisional application No. 60/073,637, Feb. 4, 1998.

[51] Int. Cl.[7] .................................................. A47L 1/02
[52] U.S. Cl. ................................. 15/102; 15/77; 15/88.3
[58] Field of Search ....................... 15/102, 88.3, 88.2, 15/77, DIG. 14, 97.1; 134/1.3, 902

[56] References Cited

U.S. PATENT DOCUMENTS

| | | | |
|---|---|---|---|
| 947,151 | 1/1910 | Eick ............................................. | 15/64 |
| 2,819,723 | 1/1958 | Meyer . | |
| 3,761,984 | 10/1973 | Hauschild et al. ....................... | 15/88.3 |
| 4,170,241 | 10/1979 | Clapp ........................................ | 134/83 |
| 4,202,071 | 5/1980 | Scharpf .............................. | 15/DIG. 14 |
| 5,286,657 | 2/1994 | Bran . | |
| 5,317,778 | 6/1994 | Kudo et al. ............................... | 15/88.3 |
| 5,475,889 | 12/1995 | Thrasher et al. . | |
| 5,593,505 | 1/1997 | Erk et al. . | |
| 5,606,251 | 2/1997 | Ryle et al. . | |
| 5,624,501 | 4/1997 | Gill, Jr. . | |
| 5,639,311 | 6/1997 | Holley et al. . | |
| 5,723,019 | 3/1998 | Krussell et al. . | |
| 5,806,126 | 9/1998 | de Larios et al. . | |
| 5,809,832 | 9/1998 | Gockel et al. . | |
| 5,875,507 | 3/1999 | Stephens et al. ......................... | 15/102 |
| 5,890,251 | 4/1999 | Terui ........................................ | 15/102 |
| 5,933,902 | 8/1999 | Frey ......................................... | 15/102 |

FOREIGN PATENT DOCUMENTS

| | | |
|---|---|---|
| 0526245A1 | 3/1993 | European Pat. Off. . |
| 814840 | 9/1951 | Germany . |
| WO 97/13590 | 4/1997 | WIPO . |
| WO 98/02904 | 1/1998 | WIPO . |

*Primary Examiner*—Robert J. Warden, Sr.
*Assistant Examiner*—Kaj K. Olsen
*Attorney, Agent, or Firm*—Faustion A. Lichauco, Esq.; Lahive & Cockfield, LLP

[57] ABSTRACT

A wafer cleaning apparatus provides two opposed brushes for brushing a vertically disposed wafer in a tank which can contain a process liquid. A pressure controller adaptively controls the pressure exerted by the brushes on the wafer to compensate for brush wear. Rim driving wheels engage the wafer periphery with a porous jacket coupled to a fluid delivery system, thereby simultaneously rotating and cleaning the periphery of the wafer. The apparatus includes a fluid delivery system for separately and independently delivering a plurality of constituents of a cleaning solution to the brushes, thereby ensuring that a freshly mixed cleaning solution reaches the wafer. The tank can be filled with a process liquid through which megasonic waves provided by a transducer can propagate and impinge upon the wafer thereby enhancing the cleaning of the wafer or the brushes.

33 Claims, 9 Drawing Sheets

WAFER CLEANING METHOD AND SYSTEM

RELATED APPLICATIONS

This application is a continuation-in-part of and incorporates by reference the commonly-owned, co-pending United States Provisional Application, 60/073,637 filed on Feb. 4, 1998.

FIELD OF THE INVENTION

This invention relates to the field of processing a substrate, and in particular, to methods and devices for cleaning particulates and other contaminants from, for example, a semiconductor wafer.

BACKGROUND

The process of manufacturing integrated circuits typically consists of more than a hundred steps during which hundreds of integrated circuits are formed on a single semiconductor wafer. Generally, this process involves the creation of multiple layers on the semiconductor wafer This layering process forms the electrically active regions on the wafer's surface.

After completion of each layer, it is common practice to thoroughly clean, rinse, and dry the wafer. Because the formation of each layer depends on the accuracy and precision with which the previous layer was formed, it is critical that each layer be free of contaminants or surface impurities. In recent years, the smaller size, and hence increased density of microelectronic components, has increased the demand for more effective control of contamination.

A current method for removing contaminants from the surface of a semiconductor wafer uses a sponge roller to mechanically scrub the wafer's surface in the presence of a cleaning solution. In some practices of this method, cleaning solution is applied either by directing a high pressure spray against the wafer or by dripping cleaning solution on the sponge rollers. Typically, the wafer is positioned horizontally between two rotating sponge rollers. During this scrubbing cycle, the wafer is rotated by an edge handling apparatus to ensure that the sponge rollers engage and scrub substantially the entire surface of the wafer.

Upon completion of the scrubbing cycle, the wafer is typically transferred to a rinsing-drying stage separate from the scrubbing stage. Typically, this transfer is effected by moving conveyor belts on which the wafer rests during the scrubbing cycle. These belts, which frictionally engage the bottom surface of the horizontally disposed wafer, are prone to leave residue on the wafer.

In this rinsing-drying stage, the wafer typically rests horizontally on a spindle chuck which spins at high speeds. A stream of de-ionized water sprayed onto the surface of the spinning wafer forms a thin film on the wafer's surface. In some cases, an acoustic transducer mounted on a probe hydroplaning on the surface of this film generates megasonic waves that propagate through the film. These waves assist in dislodging any particles remaining after the scrubbing cycle. As the wafer spins, the de-ionized water, and any contaminant particles suspended within it, are driven off the periphery of the wafer by centrifugal force. This eventually dries the wafer surface.

Commonly used wafer diameters have thus far been small enough so that the internal forces generated during the spinning of the wafer are, in most cases, insufficient to stress or break the wafer. However, the recently introduced 300 mm wafers are so large that internal forces generated during the spinning of the wafer significantly increase the probability of breakage. This is further exacerbated by the fact that, in 300 mm wafers, the de-ionized water travels further to reach the periphery. Consequently, spin drying 300 mm wafers requires high rotational speed to generate enough centrifugal force to rapidly move the de-ionized water from the center to the periphery of the wafer.

The foregoing wafer cleaning method has additional disadvantages which are unrelated to the size of the wafer. For example, megasonic energy is incident on the wafer only during the rinsing step. The lack of megasonic energy during the scrubbing step forecloses any synergistic operation between the operations of brush scrubbing and of megasonic bombardment. In addition, the sponge rollers, which are never exposed to the cleaning effect of megasonic energy, are prone to become dirty and to wear prematurely. This significantly increases the operating costs of the wafer-scrubbing machine.

Because megasonic energy effective for cleaning generally requires transmission through a liquid, devices for megasonic cleaning provide for submerging a wafer in a liquid while exposing it to megasonic energy. It has long been considered, therefore, that an apparatus for simultaneously scrubbing a substrate while it is exposed to megasonic energy would require immersion of moving mechanical parts. Any stray particles generated by these moving mechanical parts would contaminate the surrounding liquid. As a result, prior art cleaning devices typically separate the brushing step from the megasonic cleaning step, as in the manner set forth above. Consequently, these cleaning devices forego any synergistic effect associated with simultaneous brushing and megasonic cleaning.

In the foregoing prior method, a cleaning solution consisting of one or more liquids is typically mixed together and applied to the surface of the wafer, either by spraying the mixture onto the surface of the wafer or by passing it through a sponge roller mounted on a hollow brush core and allowing it to perfuse through the sponge roller. However, certain mixtures lose their cleaning potency soon after they are mixed. It is preferable that such cleaning mixtures be applied to the surface shortly after they are mixed.

Since a typical cleaning cycle can use several different cleaning solutions at different stages of the cycle, it is advantageous to provide a system for quickly and efficiently switching from a first cleaning solution to a second cleaning solution. In the case in which the cleaning solution is passed into a hollow brush core for perfusion through the sponge, an appreciable volume of cleaning solution remains in the brush core. Thus, in order to change cleaning solutions, a significant residual volume of the first cleaning fluid must be removed from the brush core before the second cleaning fluid can be used. In cases in which there exists an undesirable reaction between the old and new cleaning solutions, this already time-consuming step is further lengthened by the need to flush the first cleaning solution with a non-reactive fluid rather than with the second cleaning solution.

The known practice of exposing the wafer to the second cleaning solution by transporting it to a different scrubbing stage as an alternative to changing the cleaning fluid in a scrubbing stage is unsatisfactory. This known practice requires additional clean room space to accommodate the additional scrubbing stage. In addition, the wafer transport mechanism for transporting the wafer from one scrubbing stage to another can introduce contaminants.

In the known method for cleaning a wafer with a cylindrical brush-sponge, it is preferable to rotate the wafer as it is being scrubbed to insure that all points on the surface of the wafer are exposed to the sponge roller. Current methods of rotating the wafer include the use of rim driving wheels that rotate the wafer by engaging its periphery. These wheels, which are typically made of a hard plastic such as polyurethane, can undermine the entire cleaning process by leaving contaminants on the peripheral region of the wafer.

The prior art includes numerous attempts to avoid the foregoing disadvantages. For example, in some wafer cleaning machines, a nozzle sprays liquid on the periphery of the wafer as the wafer is rotated in an effort to remove particles left behind by the rim driving wheels. Other wafer cleaning machines provide rim driving wheels made of relatively soft plastic materials.

The pressure exerted on the wafer by the sponge roller is an important factor in effective cleaning of wafers. If this sponge pressure is too low, scrubbing is largely ineffective. If the sponge pressure is too high, particulates can inflict damage on the wafer by gouging its surface. The applied sponge pressure is determined, in part, by the thickness of the sponge and by the thickness of the wafer. If each thickness is known, one can readily apply a selected pressure by setting an appropriate distance between the sponge and the wafer.

The difficulty encountered in the foregoing method of controlling brush pressure is that these thicknesses are dynamically changing quantities. For example, as the sponge roller wears, its thickness can decrease. This typically results in a reduction in the brush pressure and an accompanying reduction in cleaning effectiveness. It is known in the art to automatically adjust the distance between the sponge roller and the wafer according to a predetermined schedule based on empirical observations of the sponge roller's wear as a function of time. However, such a method, relying as it does on a statistically derived quantity, can easily result in application of pressure that is not the optimal pressure.

When the sponge roller ultimately wears out, it becomes necessary to replace it. In current wafer cleaning machines, replacement is accomplished by removing the worn sponge roller from the brush core and inserting the brush core through a fresh sponge roller. Since the sponge roller is typically a cylindrical tube of soft sponge-like material having an inner diameter slightly smaller than the outer diameter of the brush core, it is difficult and time consuming to insert the brush core through the sponge roller. The difficulty of this task frequently results in damage to or contamination of the sponge roller. This results in increased operational expenses, because damaged sponge rollers must be discarded, or reduced yield, because contaminated sponge rollers are unlikely to clean wafers effectively.

SUMMARY OF THE INVENTION

A wafer cleaning system according to the invention includes a frame on which are mounted two brush devices and a wafer rotating mechanism. The first brush device has a rotational axis parallel to a first face of a wafer to be cleaned and the second brush device has a rotational axis parallel to a second face of this same wafer. Both brush devices are configured to rotate about their respective axes. The wafer rotating mechanism is configured to engage a vertically oriented wafer and thereby rotate it about a rotational axis orthogonal to the first face of the wafer.

In one embodiment, the frame contains a tank into which the wafer can be partially immersed in a process liquid. In this embodiment, as the wafer is rotated, selected sections of the wafer are alternately above or below the surface of the process liquid. A megasonic transducer can be provided to generate megasonic waves which propagate through the process liquid and impinge upon those sections of the wafer immersed in process fluid, thereby cooperating with the brush devices in removing contaminants from the wafer.

The wafer cleaning system can further include a pressure controller which adaptively maintains a selected pressure between the brush device and the wafer to be cleaned. Such a pressure controller can be implemented by providing two arms, each of which has a pivoting end coupled to a drive mechanism and a free end having a brush device mounted thereon. In response to the force exerted by one or both brush devices on the wafer, the drive mechanism exerts a force on the arms.

Each brush device can have an associated fluid transport system for delivering a plurality of fluids separately and independently to a cleaning element forming the brushing surface of the brush device. The cleaning element, which can be a porous sponge material such as PVA, can be mounted on a brush core having fluid passages or channels arranged thereon for delivery of a fluid to the cleaning element. A manifold housing having a plurality of manifolds enclosed therein can be provided. Each such manifold operates independently of the remaining manifolds to deliver a fluid from a fluid reservoir to a channel.

The brush core can include a sleeve engaged either frictionally, or by mechanical attachment, or by adhesion, with the cleaning element and an inner core within the sleeve. Both the inner core and the sleeve have fluid passageways which are in fluid communication with each other. This fluid communication can be achieved by aligning the fluid passageways with the perforations on the sleeve. In a preferred embodiment, the fluid passageways on the sleeve are perforations and those on the core are channels or grooves on the surface of the core.

The inner core and the sleeve having a cleaning element mounted thereon are removably and replaceably engaged with each other. As a result, when the cleaning element requires replacement, the sleeve, with the cleaning element engaged thereon, can readily be removed from the inner core and replaced with a sleeve having a fresh cleaning element already mounted thereon.

A wheel member arranged for selective engagement of the periphery of the workpiece can provide the workpiece rotating mechanism of the invention. Such a wheel member can include a wheel having a rim disposed for contacting the peripheral region of the wafer and a porous or fluid permeable jacket, which can be a porous or open cell sponge material, having an inner surface engaged with the rim and an outer surface exposed for engagement with the peripheral region of the wafer. The wheel member can further include a fluid delivery system for passing fluid to the inner surface of the jacket, thereby providing fluid which percolates or perfuses to the outer surface of the jacket. Such a fluid delivery system can include a fluid guiding passage having a distal end connected to a source of fluid and a proximal end connected to an aperture in the rim.

A fuller understanding of the nature and objects of the invention will be apparent from the following detailed description and the accompanying drawings in which:

DETAILED DESCRIPTION OF THE ILLUSTRATED EMBODIMENT

Overview

A wafer cleaning apparatus according to the invention integrates, into a single housing, several subsystems which cooperate to clean both sides of a vertically oriented semiconductor wafer.

The housing contains within it a process tank for providing control over the level of process liquid, if any, into which the wafer is partially immersed during cleaning. A scrubbing subsystem provides brushes for mechanically scrubbing the wafer with a pre-selected brush pressure.

The scrubbing subsystem is coupled to a brush arm pivoting mechanism for controlling the pressure exerted by the brushes on the wafer. The brush pivoting mechanism includes a feedback loop which enables it to adaptively respond to changes in brush pressure caused by brush wear.

The scrubbing system is also coupled to a fluid delivery subsystem which provides for delivery of a plurality of fluids to the cleaning surfaces of the brush. A salient feature of the apparatus is that the fluids are delivered to the brush surface independently so that mixing of the fluids occurs on the surface of the brush.

To ensure that all parts of the wafer come into contact with the scrubbing subsystem, the wafer is rotated by a wafer rotating mechanism. This wafer rotating mechanism rotates the wafer by engaging its periphery and imparting to it a rotational force. A second fluid delivery subsystem coupled to the wafer rotating mechanism applies cleaning fluid to the periphery of the wafer thereby enabling the wafer rotating mechanism to simultaneously rotate wafer and clean those portions of the wafer with which it comes into contact.

Finally, the process tank can optionally be coupled to a megasonic subsystem which can transmit megasonic waves through the process liquid in the process tank. These megasonic waves enhance the cleaning action of the scrubbing system.

Housing

Figure 1:
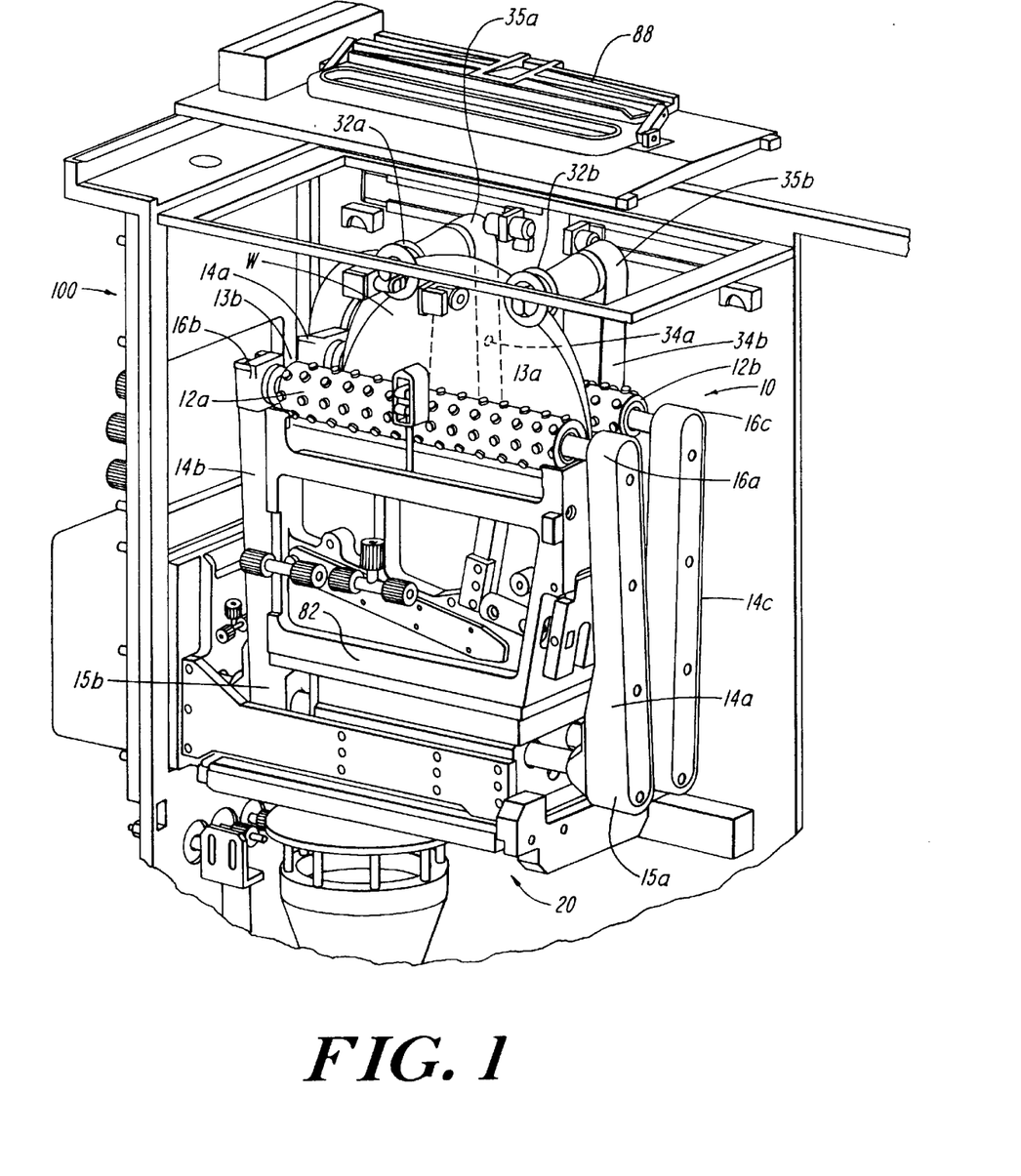
FIG. 1 is an isometric view, partly cut-away, of a wafer cleaning apparatus according to the invention.

FIG. 1 shows a plenum tank 84 within which a process tank 82 is mounted. The plenum tank 84 has a lid 88 through which a wafer W can be inserted into the process tank 82. Within the process tank 82, the wafer W rests on supports 86a–c protruding from the bottom of the tank 82 and best seen in FIG. 2.

Figure 2:
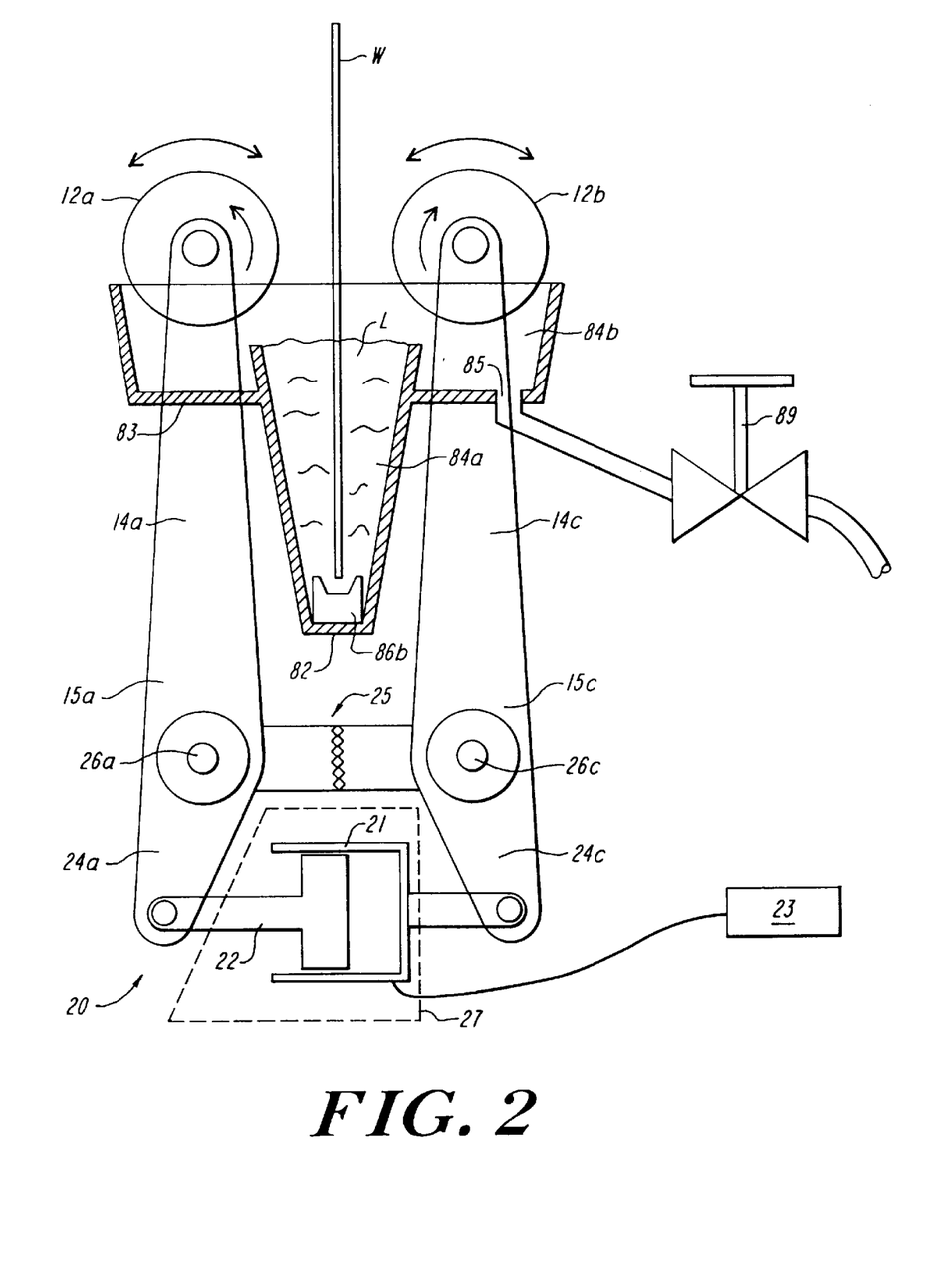
FIG. 2 is a simplified view showing the scrubbing subsystem and brush pivoting mechanism of the wafer cleaning apparatus of FIG. 1.

The process tank 82, shown in cross section in FIG. 2, includes a wafer-cleaning section 84a and a wider brush-cleaning section 84b formed by a shoulder 83. When process liquid L fills the wafer-cleaning section 84a, the wafer W is partially immersed in the process liquid L while the brushes 12a, 12b remain above the surface of the process liquid L. When process liquid L fills the brush cleaning section 84b, the brushes 12a, 12b are immersed in the process liquid L.

A drain valve 89 connected to a drain 85 in the shoulder 83 controls the level of the process liquid L. When the drain valve 89 is closed, the level of the process liquid L rises to fill the brush cleaning section 84b. When the drain valve 89 is open, any process liquid L beyond that required to fill the wafer cleaning section 84a overflows onto the shoulder 83 and drains away through the drain 85. As a result, when the drain valve 89 is open, the process liquid L cannot fill the brush cleaning section 84b.

Scrubbing subsystem

In a wafer cleaning apparatus 100 embodying the invention, the scrubbing subsystem 10, as shown in FIG. 1, includes a first brush arm 14a extending upward from its pivotably mounted end 15a, which is coupled to a brush pivoting mechanism 20 disposed outside of the process tank 82, to its free end 16a. A second brush arm 14b opposed to the first brush arm 14a also extends upward from its pivotably mounted end 15b, which is likewise coupled to the brush pivoting mechanism 20, to its free end 16b. Between the free ends 16a, 16b of the first and second arms extends a first cylindrical brush 12a having a first end 13a rotatably mounted to the free end 16a of the first brush arm 14a and a second end 13b rotatably mounted to the free end 16b of the second brush arm 14b. The major axis of the first cylindrical brush 12a thus extends between the free ends 16a, 16b of the first and second brush arms 14a, 14b.

Third and fourth brush arms 14c, 14d likewise extend upward from their pivoted ends 15c, 15d, both of which are coupled to the brush pivoting mechanism 20, to their corresponding free ends 16c, 16d. The two ends 13c, 13d of a second cylindrical brush 12b are likewise rotatably mounted to the free ends 16c, 16d such that the major axis of the brush 12b extends between the free ends 16c, 16d of the third and fourth arms 14c, 14d. The third and fourth arms 14c, 14d stand opposed to the first and second arms 14a, 14b such that the major axis of the first cylindrical brush 12a is parallel with the major axis of the second cylindrical brush 12b.

As shown in the side view of FIG. 2, the first and second cylindrical brushes 12a, 12b define a gap or opening therebetween. The space between these two brushes 12a, 12b, and hence the width of this gap, can be adjusted by pivoting the first and second brush arms 14a, 14b relative to the third and fourth brush arms 14c, 14d. In the wafer loading position, shown in FIG. 2, the gap is sufficiently wide to permit a wafer W to be placed into the gap. In the wafer cleaning position, the brush arms 14a–14d are pivoted so as to form a gap sufficiently narrow to enable the brushes 12a, 12b to contact the wafer W. In this position, the brushes 12a, 12b can exert a pressure against the faces of a wafer placed in the gap.

The illustrated brush pivoting mechanism 20 shown in FIG. 2 includes a piston 22 which forms an airtight seal inside a cylinder 21. The position of the piston 22 within the cylinder 21 can be adjusted by increasing the air pressure within the cylinder 21. This air pressure is under the control of a brush pressure controller 23 which is responsive to the pressure exerted by at least one of the first and second cylindrical brushes 12a, 12b against the wafer W.

As shown in FIG. 2, the pivotably mounted end 15a of the first brush arm 14a is coupled, at a first pivot point 26a, to a first ear 24a. In a similar manner, the pivotably mounted end 15c of the third brush arm 14c is coupled, at a second pivot point 26c opposite the first pivot point 26a, to a second ear 24c. The first and second ears 24a, 24c are pivotably coupled to the piston 22 and cylinder 21 respectively. Opposed gear teeth 25, attached to the first and third brush arms 14a, 14c respectively, are disposed to engage each other such that the first and third brush arms 14a, 14c move in a coordinated manner.

It will be appreciated that the second and fourth brush arms 14b, 14d can be coupled in a manner similar to the first and third brush arms 14a, 14c. If the first and second brush arms 14a, 14b are connected by a first connecting rod (not shown) and the third and fourth brush arms 14b, 14d are connected by a second connecting rod (not shown), it will be clear to one skilled in the art that a single piston 22 and cylinder 21 can control the pressure exerted by the first and second cylindrical brushes 12a, 12b on the two faces of the wafer W. Alternatively, a separate cylinder and piston can be provided for pivoting the first and third brush arms 14a, 14c independently of the second and fourth brush arms 14b, 14d. In such a case, the pressure exerted by the first and second brushes 12a, 12b can be varied along the chord on the wafer W.

Subsystem for delivery of cleaning solution through the brush

Because it is advantageous to deliver a cleaning solution to the surface of the wafer W during the scrubbing process, a preferred embodiment of the wafer cleaning apparatus 100 includes a fluid delivery subsystem 50 for delivering a cleaning solution to the brush 12a. This cleaning solution is typically a mixture of several fluid constituents which can be liquids or gases. Examples of such fluid constituents include nitrogen gas ($N_2$), acids such as hydrofluoric acid (HF), bases such as ammonium hydroxide ($NH_4OH$), and surfactants. In some cases, the cleaning solution loses its potency soon after its constituents are mixed together. For this reason, the preferred fluid delivery subsystem 50 mixes the constituents of the cleaning solution as closely as possible to the point at which the cleaning solution first contacts the wafer W.

Figure 9:
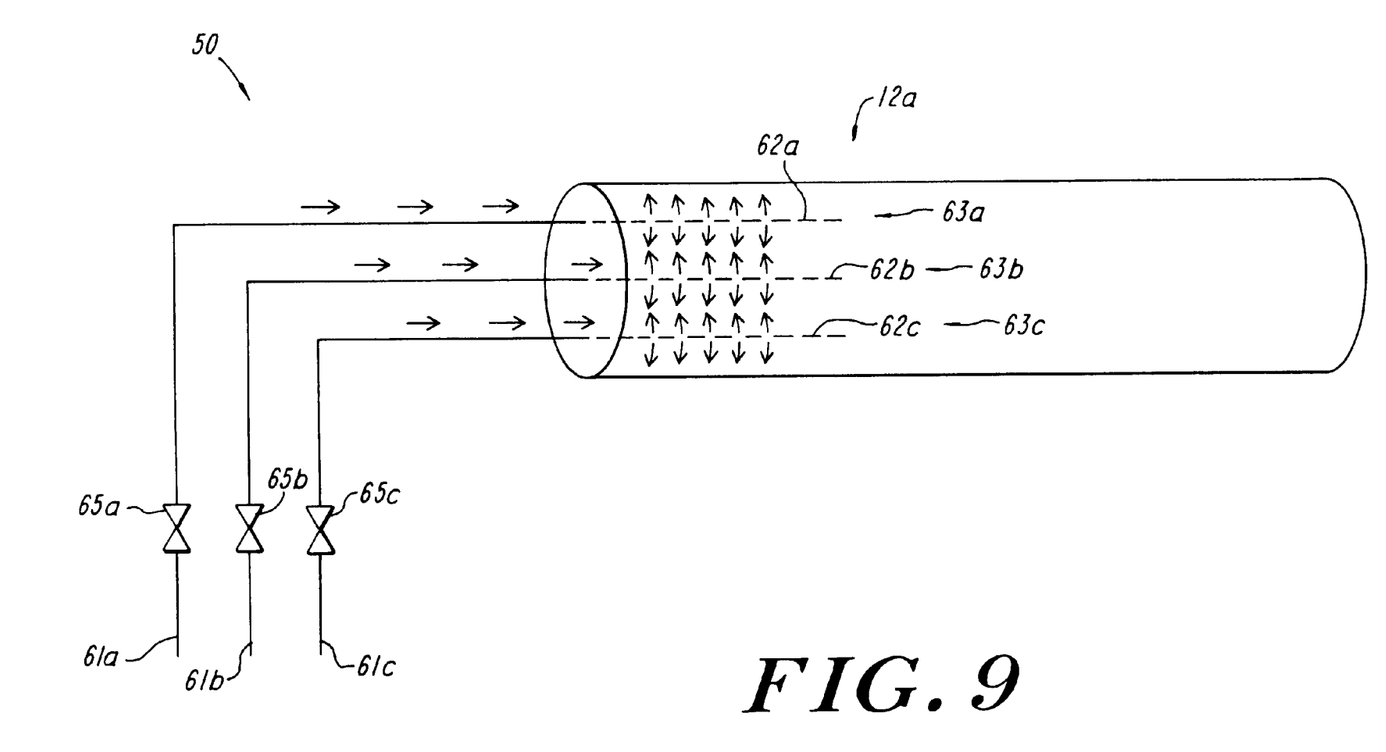
FIG. 9 is a schematic diagram showing an exemplary flow of three cleaning solution constituents on the brush of FIG. 1.

FIG. 9 shows a schematic diagram of the fluid delivery subsystem 50 of the invention. As shown therein, a first constituent flows through a first delivery tube 61a under pressure provided by a pump or other pressure source (not shown). A first control valve 59a in the path defined by the delivery tube 61a controls the volume rate of flow of the first constituent and thereby makes possible the real-time adjustment of its concentration in the cleaning solution.

Soon after it enters the interior of the brush 12a, the first constituent flows radially toward the brush surface. Just below the brush surface, the first constituent flows along an axially directed flow line 62a parallel to the major axis of the brush 12a. As it does so, it diffuses circumferentially from the flow line 62a, as shown by the pairs of opposed, circumferentially directed arrows in FIG. 9. This results in an axially directed strip 63a of the first constituent diffusing circumferentially on the surface of the brush 12a. The rate at which this circumferential diffusion occurs depends, in part, on the porosity of the brush surface, on the pressure driving the flow of the first constituent, and on the forces generated on the fluid constituent by the rotation of the brush 12a.

The remaining two constituents of the cleaning solution flow on delivery tubes 61b, 61c through control valves 59b, 59c in a similar manner. This likewise results in axially directed strips 63b, 63c of the remaining two constituents which diffuse circumferentially on the surface of the brush 12a.

It is apparent from examination of FIG. 9 that the circumferentially diffusing strips 63a–63c can overlap with each other as the strips grow wider. In those regions in which the diffusing strips overlap, there is mixing between the constituents associated with those strips. Moreover, as the brush rotates, each strip 63a–63c contacts the wafer surface at least once per rotation and deposits thereon the component carried to that strip by its corresponding delivery tube 61a–61c. In this way, the fluid delivery subsystem 50 maintains the separation of the fluid constituents until just before the cleaning solution is to be applied to the wafer W.

Figure 8:
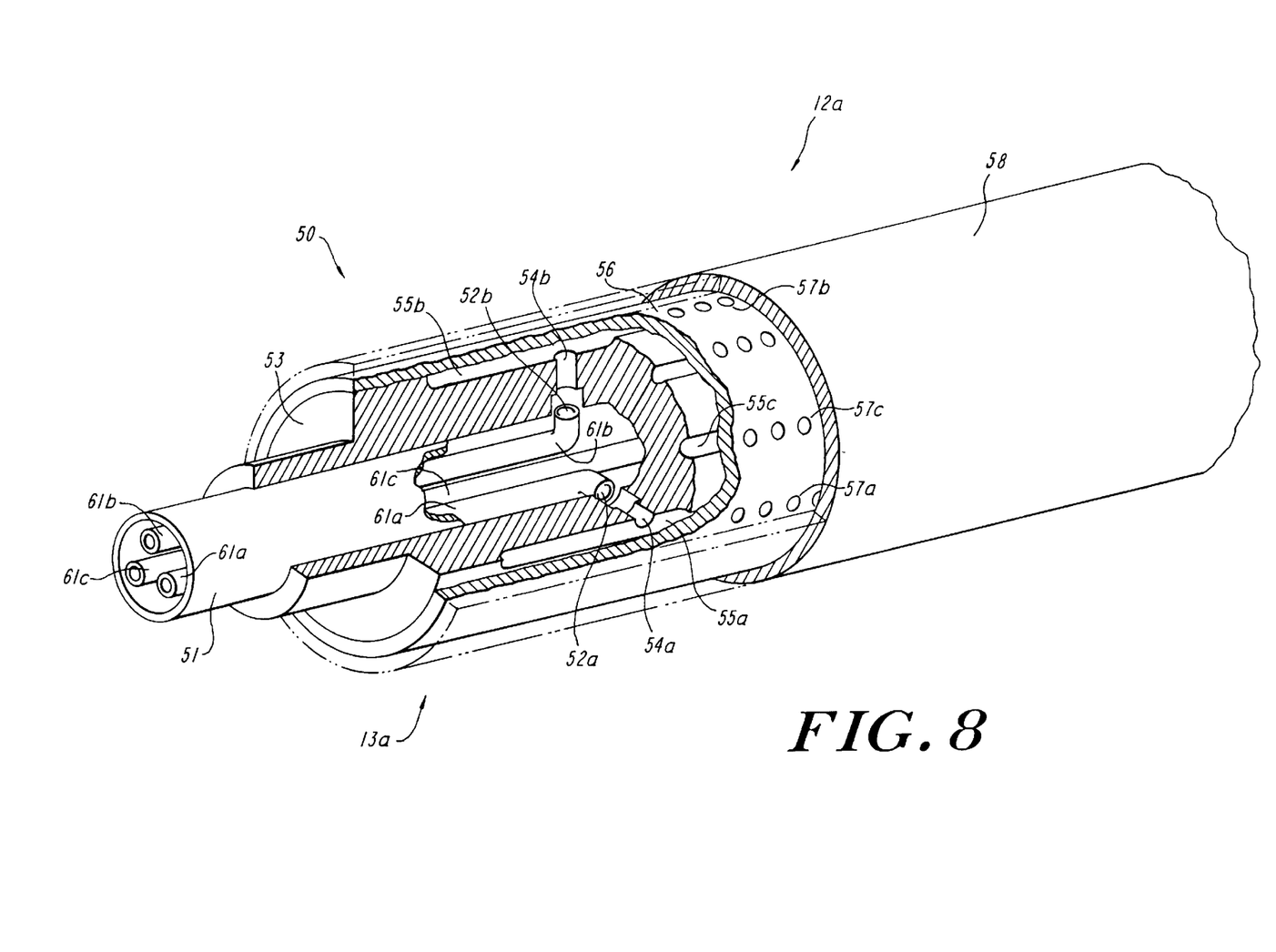
FIG. 8 is an isometric view, partly cut-away, showing the fluid delivery manifold of the brush shown in FIG. 7.

The foregoing method of mixing the constituents of the cleaning solution on the surface of the brush 12a can be implemented by the multilayer brush structure depicted in the partially cutaway view of one end 13a of a cylindrical brush 12a in FIG. 8.

As shown in FIG. 8, the brush 12a is a multilayer structure having, as its outermost layer, a porous jacket 58, preferably made of an open-cell sponge material such as PVA (polyvinyl alcohol) of a type that is typically used for wafer cleaning. The porous jacket 58 envelops a porous perforated sleeve 56 on which a large number of small perforations are arranged along several axial strips 57a–57c. The number of axial strips 57a–57c is typically, but need not be, a multiple of the maximum number of constituents in the cleaning solution.

The sleeve 56, in turn, is removably engaged over a hollow brush core 53 having several axially directed channels 55a–55c cut into its surface. Each such channel 55a has at least one channel aperture 54a on its floor through which a constituent fluid can enter the channel. In the illustrated embodiment, each channel 55a is aligned with a corresponding axial strip 57a on the perforated sleeve 56. As a result, fluid entering the channel 55a through the channel aperture 54a can exit the channel 55a through the perforations making up its corresponding axial strip 57a.

A manifold housing 51 carrying three stationary manifolds 61a–61c penetrates the space within the hollow brush core 53. Each manifold 61a is a hollow tube directed axially through the manifold housing 51. At a point proximate to a corresponding channel aperture 54a, the manifold 61a bends radially before terminating in a manifold exit aperture 52a. At least once per rotation of the brush 12a, the manifold exit aperture 52a is in fluid communication with the channel aperture 54a. In the preferred embodiment, there are three channel apertures 54a spaced circumferentially 120 degrees apart on the core 53. Thus, in the preferred embodiment, the manifold exit aperture 52a is in communication with a channel aperture 54a three times per rotation of the brush 12a. It will be appreciated that the remaining two manifolds 61b, 61c and their corresponding channel apertures 52b, 52c have similar structures and functions.

Figure 7:
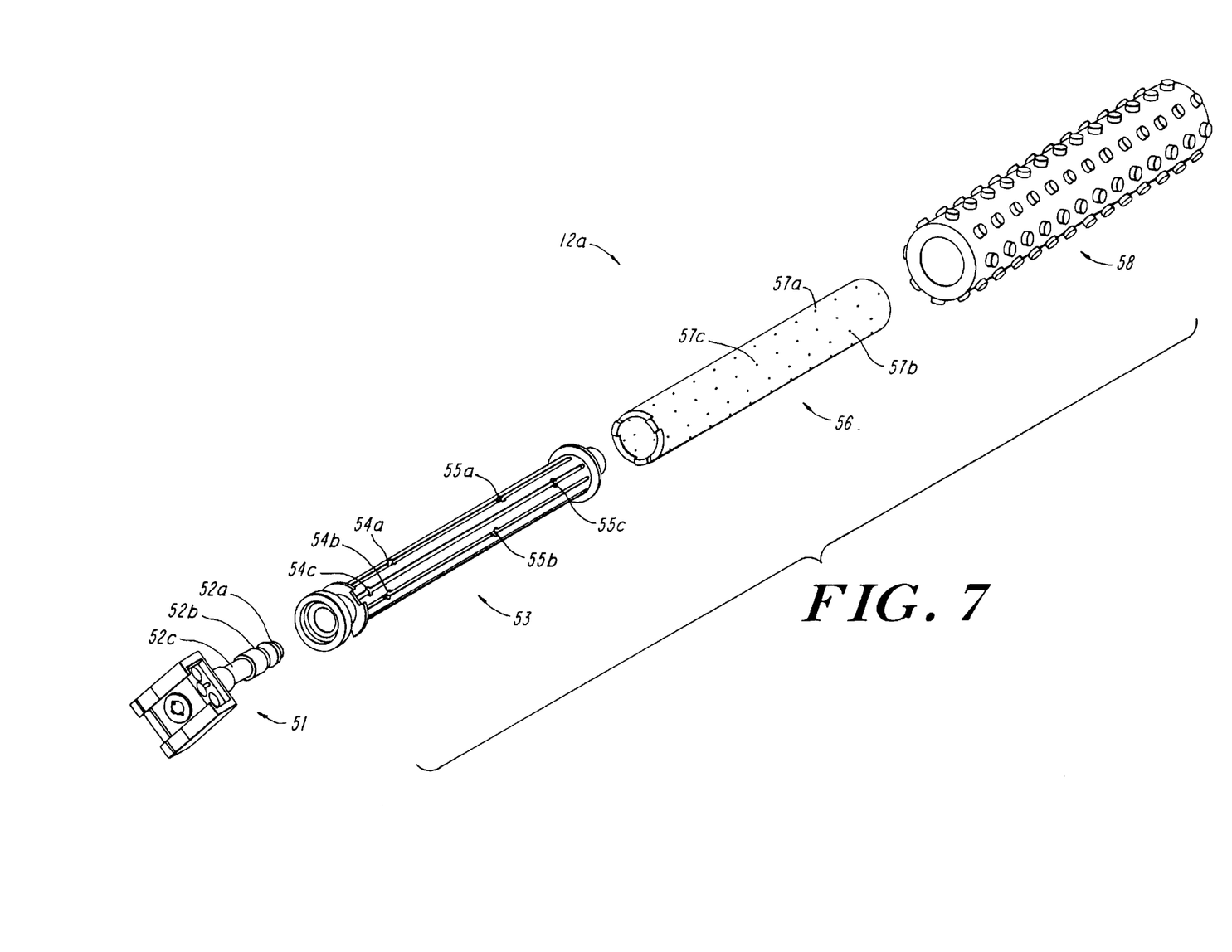
FIG. 7 is an exploded view of a brush of the scrubbing subsystem of FIG. 1.

The exploded view of FIG. 7 shows the remainder of the channel 55a extending along the major axis of the cylindrical brush core 53. The channel aperture 54a through which fluid can enter the channel 55a is shown at one end of the channel 55a. Additional channels 55b–55c are shown extending along the outer surface of the brush core 53. The channels 55a–55c are aligned with corresponding rows of perforations 57a–57c in the sleeve.

While the illustrated embodiment shows a fluid delivery system 50 for delivery of three constituents, it is readily apparent that only slight modifications are required to deliver a smaller or larger number of constituents. Additionally, variations in the placement of the illustrated apertures and channel, in the choice of which apertures and channels will deliver which constituent, and in the shapes of the apertures and channels are considered minor modifications which fall well within the scope of the appended claims.

Referring to FIGS. 8 and 9, whenever a channel aperture 54a is aligned with, and therefore in fluid communication with, a manifold exit aperture 52a, a constituent fluid flowing in the manifold 61a can exit the manifold 61a through its exit aperture 52a and enter the channel 55a by passing through the channel aperture 54a. Similarly, two additional constituent fluids can flow, independently of any other constituent fluids, through the remaining manifolds 61b–61c and out through corresponding exit apertures 52b, 52c to their corresponding channels 55b–55c on the surface of the brush core 53.

The flow of a constituent fluid through the manifold can be pulsatile, such that a pulse of constituent is released through the manifold exit aperture 52a only when the manifold exit aperture 52a is aligned with the channel aperture 54a. Alternatively, the flow of constituent can be constant, in which case a tight fit between the manifold exit aperture 52a and the inner wall of the core 53 can be relied upon to prevent constituent fluid from flowing when the channel aperture 55a is not aligned with the manifold exit aperture 52a.

It will be appreciated that the three constituent fluids filling the channels 55a–55c remain distinct and that, in this way, the illustrated fluid delivery system 50 can deliver up to three constituents of a cleaning solution close to the surface of the brush 12a without allowing them to mix prematurely. It will also be appreciated that the relative proportions of constituents comprising the cleaning solution can readily be adjusted by adjusting the valves 65a–65c. This feature permits the pressures driving the flow of constituent fluids in each of the three manifolds 61a–61c to be varied independently of each other.

The constituent fluids filling the three channels 55a–55c are forced through their corresponding rows of perforations 57a–57c in the sleeve 56. After passing through the perforations 57a–57c, the constituent fluids perfuse radially through the porous jacket 58 surrounding the sleeve 56. While in the porous jacket 58, the constituents mix and form the cleaning solution which is ultimately transferred from the outer surface of the porous jacket 58 to the surface of the wafer W.

In this manner, the cleaning solution is formed from its constituents at a point proximate to the wafer surface. This feature of the invention permits application of unstable cleaning solutions that lose their effectiveness shortly after they are mixed. Additionally, because the combined volume of constituents in the manifolds 52a–52c and in the channels 55a–55c is small, the composition of the cleaning solution can be rapidly varied.

Wafer rotating subsystem

Figure 3:
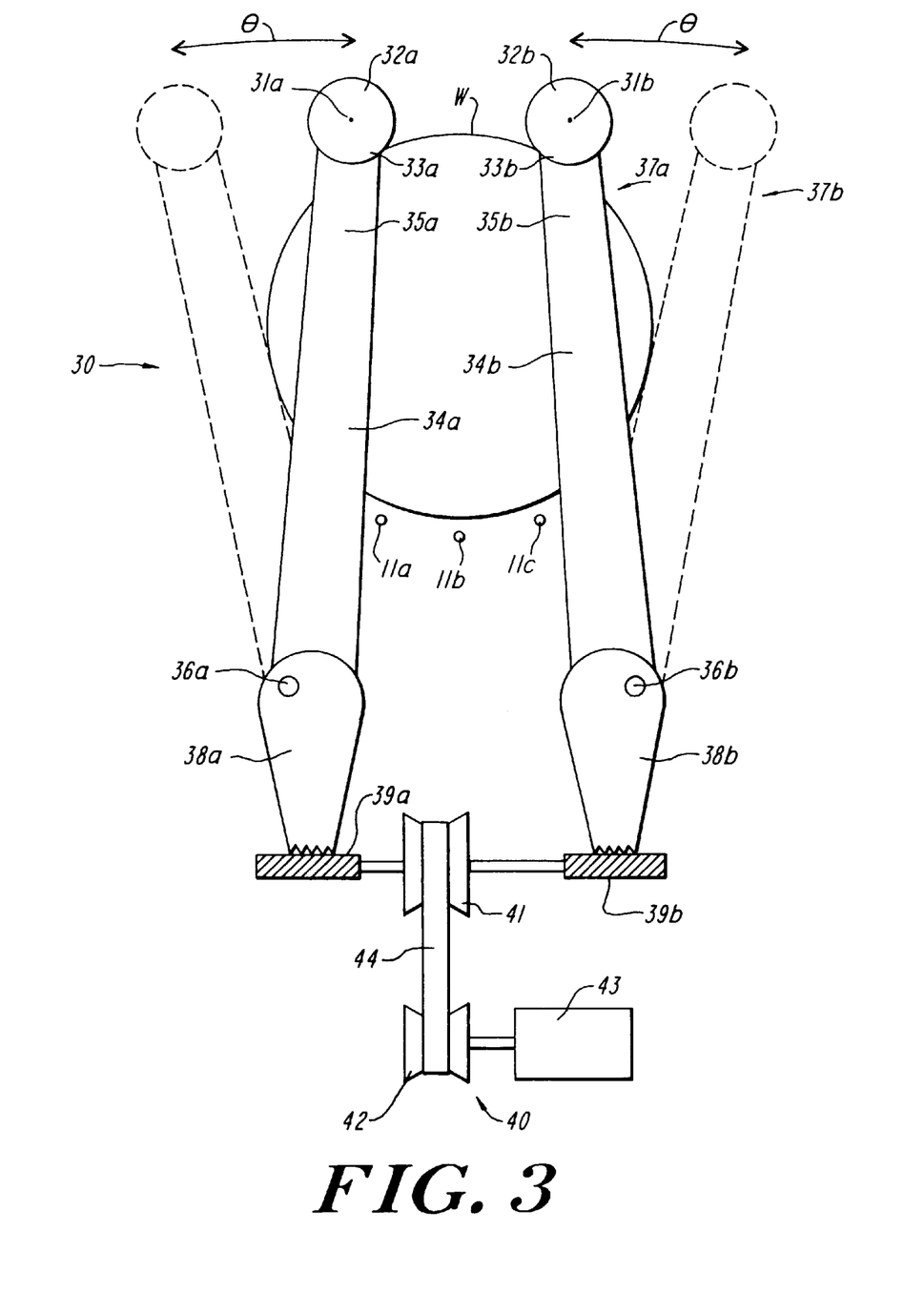
FIG. 3 is a simplified view showing the wafer rotating subsystem and support arm pivoting mechanism from the wafer cleaning apparatus of FIG. 1.

With reference to FIGS. 1 and 3, a wafer cleaning device embodying the invention includes a wafer rotating subsystem 30 which rotates the wafer W as the scrubbing subsystem 10 brushes the wafer. The illustrated wafer rotating subsystem 30 includes a first support arm 34a extending from its pivotably mounted end 36a, which is coupled to a support arm pivoting mechanism 40 mounted outside the process tank 82, to its free end 35a. A first rim driving wheel 32a is rotatably mounted to the free end 35a of the first support arm 34a such that its axis of rotation 31a is parallel to the axis about which the first support arm 34a pivots.

A second support arm 34b likewise extends from its pivotably mounted end 36b which, like the pivotably mounted end 36a of the first supporting arm 34a, is coupled to the support arm pivoting mechanism 40. A second rim driving wheel 32b is mounted to the free end 35b of the second support arm 34b such that its axis of rotation 31b is parallel to the axis of rotation 31a of the first rim driving wheel 32a. Each support arm 32a, 32b encloses a belt 45a, 45b, shown in FIG. 5, which is trained around a driving pulley 46a, 46b attached to a motor (not shown) and a driven pulley 47a, 47b attached to the rim driving wheel 32a, 32b The illustrated support arm pivoting mechanism 40, shown in FIG. 3, includes a motor 43 which turns a driving pulley 42 on which is trained a belt 44 that engages a driven pulley 41. The driven pulley 41 is coupled to rotate two opposed worm gears 39a, 39b. These gears are coupled to matching gears on opposed ears 38a, 38b. The ears 38a, 38b are coupled to pivot the supporting arms 34a, 34b about two pivot points 36a, 36b, respectively. The axes about which the support arms 34a, 34b pivot are therefore orthogonal to the axes about which the brush arms 14a–14d pivot.

Figure 4A:
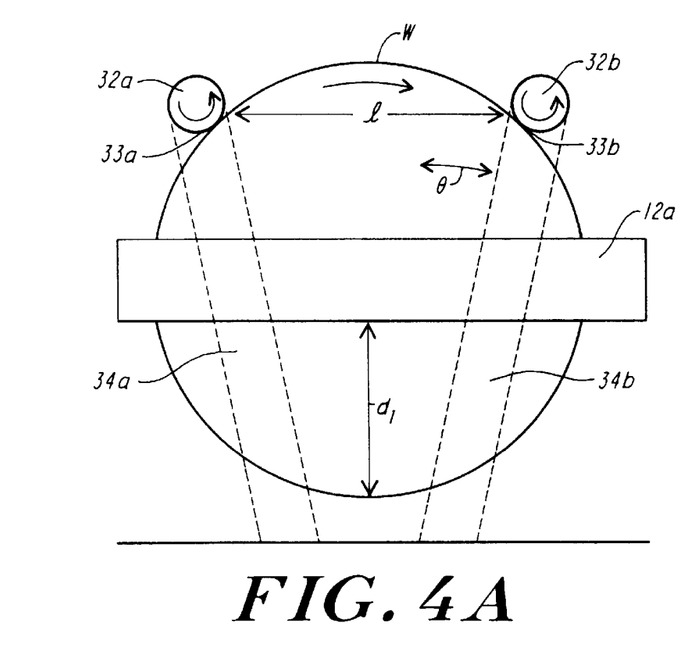
FIGS. 4A and 4B are fragmentary views showing how the wafer rotating subsystem of FIG. 3 controls the draft of the wafer.
Figure 4B:
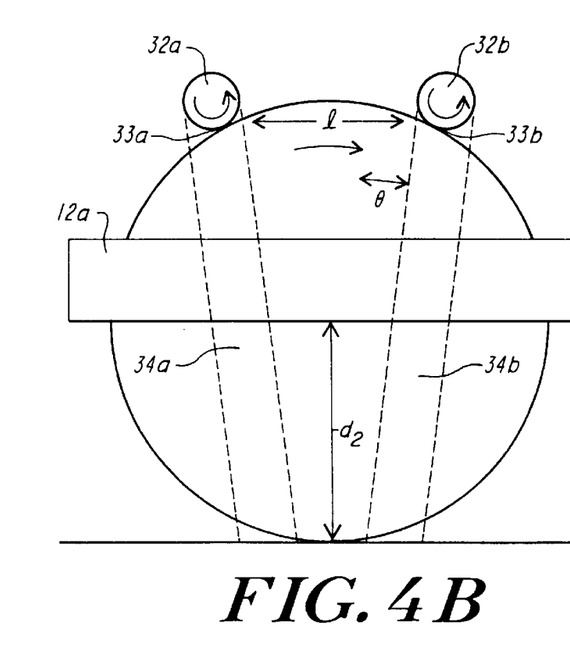

As shown in FIG. 3, the support arms 34a, 34b can be pivoted between a cleaning position 37a, shown in solid lines, and a loading position 37b, shown with broken lines. In the cleaning position 37a, the first and second rim driving wheels 32a, 32b are disposed to frictionally engage the wafer W at first and second engagement sites 33a, 33b along the periphery of the wafer W. In this cleaning position 37a, rotation of the rim driving wheels 32a, 32b imparts a rotational motion to the wafer W about an axis orthogonal to the major axes of the first and second cylindrical brushes 12a, 12b. By varying the angle θ at which the support arms 34a, 34b are pivoted, as shown in FIGS. 4A and 4B, the length 1 of the chord separating the two engagement sites 33a, 33b can be adjusted. This, in turn, controls the draft d of the wafer W relative to the brushes 12a, 12b.

When the angle θ is large, as shown in FIG. 4A, the wafer W rises a greater distance before its periphery contacts the rim driving wheels 32a, 32b. This decreases the draft $d_1$. Conversely, when the angle θ is small, as shown in FIG. 4B, the periphery of the wafer W contacts the rim driving wheels 32a, 32b sooner. This increases the draft $d_2$.

In the loading position, the rim driving wheels 32a, 32b are no longer over the gap. Consequently, in this position, a wafer W can be either placed into or removed from the gap between the first and second cylindrical brushes 12a, 12b without interference by the rim driving wheels 32a, 32b.

Subsystem for delivery of cleaning solution to wafer periphery

Figure 6:
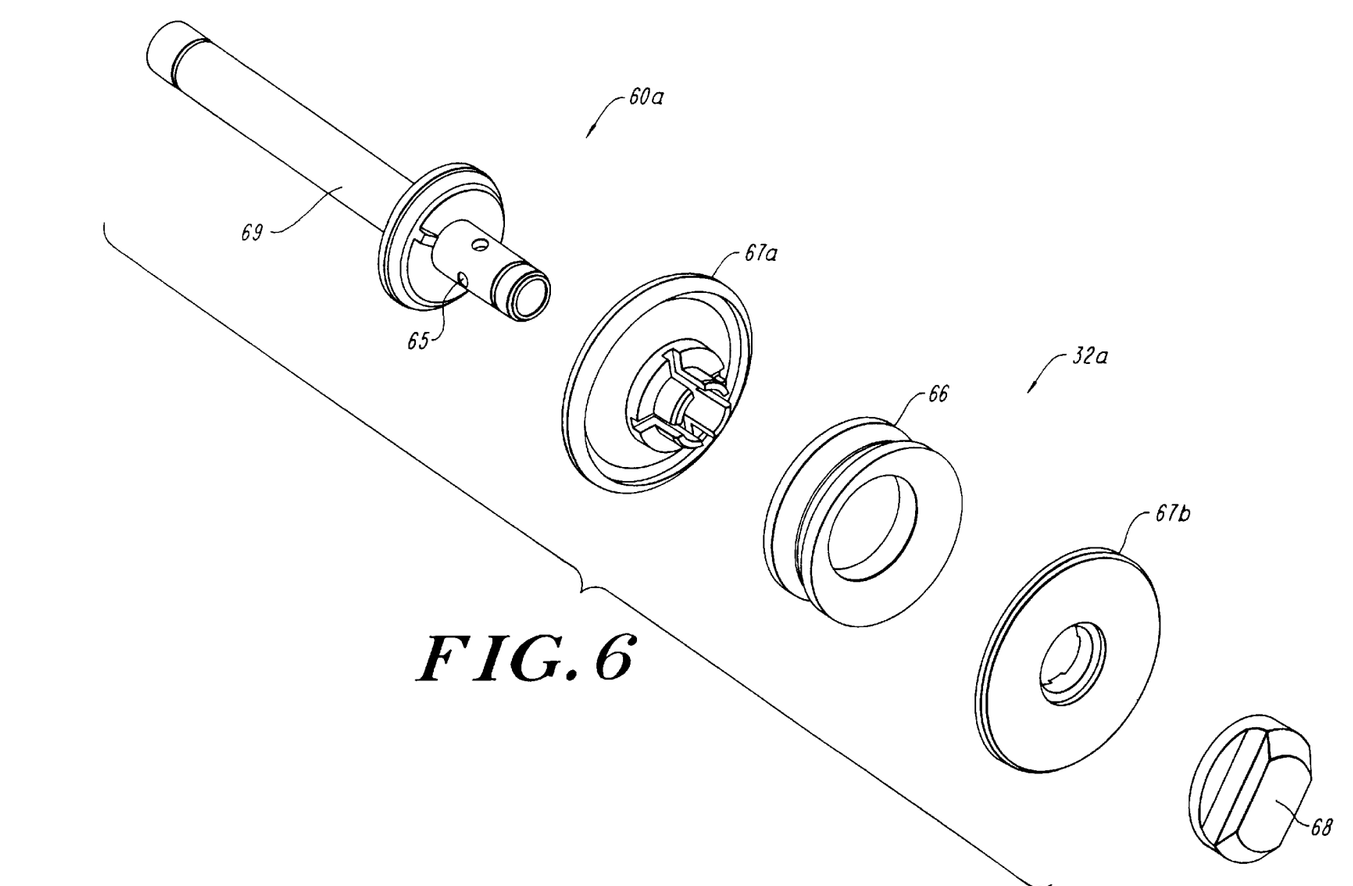
FIG. 6 is an exploded view of a rim driving wheel of the wafer rotating subsystem of FIG. 3.

In one embodiment, the rim driving wheels 32a, 32b include a fluid delivery subsystems 60a, 60b for delivering cleaning solution through them and onto the point at which they engage the wafer W. FIG. 6 shows an exploded view of the first rim driving wheel 32a and its fluid delivery subsystem 60a. The second rim driving wheel 32b preferably includes a similar fluid delivery system and hence has the same construction.

As shown in FIG. 6, the fluid delivery subsystem 60a for the rim driving wheel 32a includes a fluid delivery tube 69 having an aperture 65. The fluid delivery tube 69 slides through central holes (not shown) in a first compression disk 67a, in a second compression disk 67b, and in a porous jacket 66 sandwiched between the first and second compression disks 67a, 67b. The porous jacket 66 can be a porous or open cell sponge material, such as a PVA sponge, of the type used in connection with the cylindrical brushes 12a, 12b. An adjustable disk compressor 68 at the end of the fluid delivery tube 69 exerts a force along the axis of the fluid delivery tube 69 and toward the aperture 65, thereby compressing the porous jacket 66 between the first and second compression disks 67a, 67b.

In an embodiment having a fluid delivery subsystem 60*a* as described above, cleaning solution flowing through the fluid delivery tube 69 exits the tube 69 through the aperture 65. Fluid exiting the aperture 65 then contacts the inner surface of the porous jacket 66 and perfuses to the outer surface of the jacket 66 and onto the periphery of the wafer W. As a result, instead of leaving contaminants on the periphery of the wafer W, as do conventional rim driving wheels, the rim driving wheels 32*a*, 32*b* of this embodiment clean the periphery of the wafer W as they rotate the wafer W.

Megasonic transducer subsystem

Figure 5:
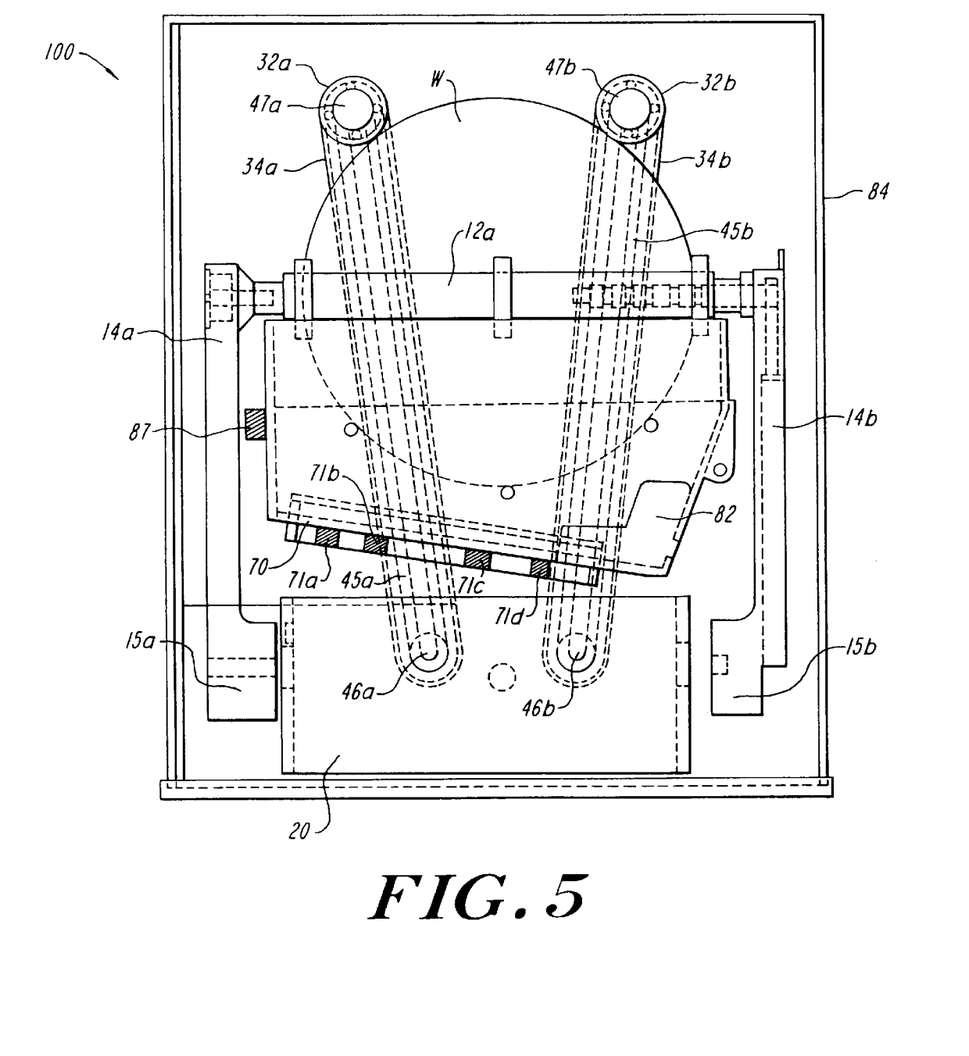
FIG. 5 is a side elevation view of the wafer cleaning apparatus shown in FIG. 1.

It has been found that the cleaning efficiency of the scrubbing process set forth above can be further enhanced by bombarding the surface of the wafer with megasonic waves during the scrubbing process. Accordingly, a preferred embodiment of the wafer cleaning apparatus 100, as shown in FIG. 5, includes a megasonic transducer subsystem 70 disposed such that when the process tank 82 contains process liquid L, the megasonic transducer subsystem 70 is below the surface of that process liquid L. As shown in FIG. 5, the megasonic transducer subsystem 70 can consist of one or more megasonic transducers 71*a*–71*d* disposed flush with the bottom of the process tank 82 to avoid interference with any moving parts. However, it is understood that the megasonic transducer subsystem 70 can include megasonic transducers 71*a*–71*d* mounted on one or more different walls of the process tank 82 or in any other location in which it does not interfere with the mechanical operation of the wafer cleaning apparatus 100.

The megasonic transducers 71*a*–71*d* that constitute the megasonic transducer subsystem 70 can be operated continuously or intermittently during the cleaning cycle. The individual transducers 71*a*–71*d* can be operated simultaneously, either in phase or with a progressive phase difference between them. Alternatively, the individual transducers 71*a*–71*d* can be switched on and off in a pre-defined pattern.

The effectiveness of megasonic cleaning can be further enhanced by elevating the temperature of the process liquid L through which the megasonic waves propagate. Accordingly, a preferred embodiment includes a temperature controller 87 for maintaining the temperature of the process liquid L at a pre-selected operating temperature. A preferred operating temperature for megasonic cleaning is in the range from 40° C. to 60° C.

The frequency at which the transducers 71*a*–71*d* are operated is selected to maximize the likelihood that contaminants will be dislodged from the surface of the wafer W. These frequencies are typically in the range between 600 kHz and 1000 kHz. The transducers can be operated at a single frequency throughout the cycle, or at selected frequencies for different intervals during the cleaning cycle. Additionally, one or more transducers can sweep across the megasonic frequency range either linearly in time or according to a pre-selected time varying function.

Operation of the Preferred Embodiment

The wafer cleaning apparatus 100 offers three modes of operation: a wafer cleaning mode in which a wafer is scrubbed; an enhanced wafer cleaning mode in which the wafer is both scrubbed and subjected to megasonic energy; and a brush cleaning mode in which the wafer is absent and the brushes are exposed to megasonic energy.

In both the wafer cleaning mode and in the enhanced wafer cleaning mode, the brush pivoting mechanism 20 pivots the first and second brush arms 14*a*, 14*b* apart from the third and fourth brush arms 14*c*, 14*d* so as to increase the gap between the first and second brushes 12*a*, 12*b*. Simultaneously, the support arm pivoting mechanism 40 pivots the support arms 34*a*, 34*b* apart and into the loading position 37*b* shown in broken lines in FIG. 3. A wafer W is then inserted, typically by a robot arm (not shown), into the gap thus formed between the first and second brushes 12*a*, 12*b*. After insertion into the gap, the wafer W rests on supports 86*a*–86*c*, best seen in FIG. 3, protruding from the bottom of the process tank 82.

Once the wafer W is loaded into the process tank 82, the brush pivoting mechanism 20 then pivots the brush arms 14*a*–14*d* such that the first and second brushes 12*a*, 12*b* contact and exert a selected pressure on the front and back surfaces of the wafer W. Simultaneously, the support arm pivoting mechanism 40 pivots the support arms 34*a*, 34*b* into the cleaning position 37*a*, shown in solid lines in FIG. 3.

During the cleaning cycle, the first and second brushes 12*a*, 12*b* rotate about their respective major axes in opposite directions. This rotation imparts to the wafer a generally upward force that lifts the wafer W from the supports 86*a*–86*c* and up against the rim driving wheels 32*a*, 32*b*. At the same time, the rim driving wheels 32*a*, 32*b*, which now engage the periphery of the wafer, limit the upward motion of the wafer W caused by the rotation of the brushes 12*a*, 12*b*. The interaction between the upward force exerted by the brushes 12*a*, 12*b* on the wafer W and the downward force exerted by the rim driving wheels 32*a*, 32*b* controls the vertical position of the wafer W relative to the brushes 12*a*, 12*b*. Additionally, the rim driving wheels 32*a*, 32*b* are driven to rotate the wafer about an axis passing through its center and orthogonal to its faces. If desired, the wafer cleaning section 84*a* of the process tank 82 can be filled with a process liquid L to a level close to but not in contact with the surfaces of the brushes 12*a*, 12*b* so that as the wafer W rotates, each section of the wafer W is alternately immersed in and withdrawn from the process liquid L.

In the enhanced wafer cleaning mode, the megasonic transducer subsystem 70 generates megasonic waves in the process liquid L concurrently with the operation of the brushes 12*a*, 12*b* and the rim driving wheels 32*a*, 32*b*. Thus, in this mode, the coordinated operation of these three components results in the wafer cleaning apparatus 100 scrubbing each portion of the wafer W, dipping the recently scrubbed portion into the process liquid L for exposure to megasonic energy to loosen any particles remaining on the wafer W, and raising that portion back out of the process liquid L in order to scrub off the particles loosened by exposure to the megasonic waves in the process liquid L. This process of repeatedly scrubbing each portion of the wafer W and dipping it into the process liquid L for exposure to megasonic waves enhances the cleaning efficiency of the apparatus by exploiting the synergistic effect of near simultaneous application of brush scrubbing and megasonic bombardment. Because the mechanical components of the brushes 12*a*, 12*b* are all isolated from the process liquid L, contamination of the process liquid L is minimized.

In the brush cleaning mode of operation, the wafer W is removed from the process tank 82, the drain 85 in the shoulder 83 of the process tank 82 closes, and the brush cleaning section 84*b* is filled with process liquid L to a level high enough so that a portion of each brush 12*a*, 12*b* is immersed in process liquid L. The brushes 12*a*, 12*b* are then rotated about their respective axes. Concurrent with the operation of the brushes, the megasonic transducer subsystem 70 generates megasonic waves in the process liquid L. As a result, during each rotation of the brushes 12a, 12b at least a portion of each brush 12a, 12b dips below the level of the process liquid L. As a result, the brushes 12a, 12b are repeatedly exposed to megasonic bombardment. This has the effect of cleaning the brushes 12a, 12b, thereby prolonging their useful life and further enhancing their cleaning effectiveness during operation of the wafer cleaning apparatus 100 in either the wafer cleaning mode or in the enhanced wafer cleaning mode.

The extent to which the wafer W is above or below the brushes 12a, 12b, hereafter referred to as the draft, can be controlled by varying the positions of the engagement sites 33a, 33b. As shown in FIG. 4A, when the engagement sites 33a, 33b are far apart, the rim driving wheels 32a, 32b do not exert a downward force on the wafer W until the brushes 12a, 12b have already lifted it relatively high. As a result, in this position, the wafer's draft $d_1$ is small. Conversely, when the engagement sites 33a, 33b are closer together, as shown in FIG. 4B, the rim driving wheels 32a, 32b exert a downward force on the wafer W before the brushes 12a, 12b have lifted it very high. As a result, in this position, the wafer's draft $d_2$ is relatively large.

During the cleaning cycle, the brush pressure controller 23 periodically generates a correction signal by measuring the pressure exerted by the brushes 12a, 12b on the wafer W and comparing it with a pre-selected pressure. Variations in brush pressure can arise from nonuniformities in the radii of the cylindrical brushes 12a, 12b. Additionally, as the cylindrical porous jacket 58 wears, it becomes thinner. Consequently, the pressure exerted by the brushes 12a, 12b when the brush arms 14a–14d are at a particular location relative to the wafer will tend to decrease as the porous jacket 58 wears.

The correction signal thus generated is fed back to the brush pivoting mechanism 20. If this measured pressure exerted by the brushes 12a, 12b is too low, the brush pressure controller 23 signals the brush pivoting mechanism 20 to pivot the free ends of the brush arms 14a–14d inward toward the wafer W, thereby reducing the gap between the brushes 12a, 12b and increasing the pressure exerted on the wafer W. Conversely, if the measured pressure is too high, the brush pressure controller 23 signals the brush pivoting mechanism 20 to pivot the free ends of the brush arms 14a–14d outward and away the wafer W, thereby increasing the gap between the brushes 12a, 12b and reducing the pressure exerted on the wafer W.

After a selected cleaning interval, both the brush arms 14a–14d and supporting arms 34a, 34b pivot back into their respective wafer loading positions. The scrubbed wafer W can then be lifted out of the process tank 82, typically by a robot arm (not shown), for further processing by, for example, a surface tension gradient drying stage.

If necessary, the cylindrical porous jacket 58 can be replaced by disengaging the sleeve 56 from the brush core 53 and replacing it with a sleeve on which a porous jacket has been pre-mounted. This eliminates the difficulty inherent in attempting to slide the porous jacket 58, which is typically a cylinder made of a soft, sponge-like material, onto a core 53 having an outer diameter larger than the inner diameter of the porous jacket 58.

The present invention is, of course, in no way restricted to the specific disclosure of the specification and drawings, but also encompasses any modifications within the scope of the appended claims.

It will thus be seen that the invention efficiently overcomes the disadvantages set forth above. Since certain changes may be made in the above constructions without departing from the scope of the invention, it is intended that all matter contained in the above description or shown in the accompanying drawings be interpreted as illustrative and not in a limiting sense.

It is also to be understood that the following claims are intended to cover all generic and specific features of the invention described herein, and all statements of the scope of the invention which as a matter of language might be said to fall therebetween. Having described the invention, what is claimed as new and secured by Letters Patent is:

1. An apparatus for cleaning a vertically oriented workpiece having opposed first and second faces, said apparatus comprising
   a frame,
   a tank mounted on said frame for supporting said vertically oriented workpiece therein,
   an acoustic transducer coupled to said tank for generating an acoustic wave in process liquid contained therein,
   a first brush device for brushing said first face while said workpiece is supported in said tank, said first brush device mounted on said frame and configured to rotate about a first axis parallel to said first face,
   a second brush device for brushing said second face while said workpiece is supported in said tank, said second brush device mounted on said frame and configured to rotate about a second axis parallel to said second face, and
   a workpiece rotation mechanism mounted on said frame and selectively engageable with said workpiece for rotating said workpiece about a third axis normal to said first face of said workpiece.

2. The apparatus of claim 1 further comprising
   a pressure controller coupled to said first brush device for adaptively maintaining a selected pressure exerted by said first brush device on said first face.

3. The apparatus of claim 2 wherein said pressure controller comprises
   a first arm having a pivoting end and a free end, said pivoting end being mounted for rotation relative to said tank and said free end having said first brush device mounted thereon,
   a second arm having a pivoting end and a free end, said pivoting end being mounted for rotation relative to said tank and said free end having said second brush device mounted thereon,
   a drive mechanism operatively coupled for exerting a first force on said first arm and a second force opposed to said first force on said second arm, said drive mechanism being responsive to said first and second forces, and
   a sensor coupled to said drive mechanism for sensing said first and second forces exerted by said drive mechanism.

4. The apparatus of claim 3 wherein said drive mechanism comprises a pneumatically operated mechanism.

5. The apparatus of claim 2 wherein said pressure controller comprises
   brush mounting means for supporting said first and second brush devices,
   brush positioning means coupled to said brush mounting means for moving said brush mounting means relative to said workpiece and thereby causing said first and second brush devices to exert a controlled brush pressure thereon, and pressure sensor means for sensing said brush pressure and communicating said brush pressure to said brush positioning means.

6. The apparatus of claim 1 wherein said first brush device further comprises a cleaning element forming a brushing surface of said first brush device, and a fluid transport system for delivering each of a plurality of fluids separately to said cleaning element.

7. The apparatus of claim 6 wherein said first brush device includes a brush core having said cleaning element mounted thereon, and said fluid transport system comprises a first fluid passageway on said brush core for delivery of a first fluid to a first location on said cleaning element, and a second fluid passageway disposed within said brush core for delivery of a second fluid to a second location on said cleaning element, said second fluid being delivered independently of said first fluid.

8. The apparatus of claim 7 wherein said brush core comprises a sleeve having a first fluid passageway, said sleeve being engaged to said cleaning element, and an inner core disposed within said sleeve, said inner core having a second fluid passageway in fluid communication with said first fluid passageway.

9. The apparatus of claim 8 wherein said first fluid passageway is aligned with said second fluid passageway.

10. The apparatus of claim 8 wherein said inner core and said sleeve are removeably and replaceably engaged with each other.

11. The apparatus of claim 6 wherein said cleaning element comprises a porous sponge disposed to engage said workpiece.

12. The apparatus of claim 1 further comprising means for drying said workpiece by surface tension gradient drying.

13. The apparatus of claim 1 wherein said workpiece rotating means comprises a wheel member arranged for selective engagement with a peripheral region of said workpiece.

14. The apparatus of claim 13 wherein said wheel member comprises a wheel having a rim disposed for contact with said peripheral region of said workpiece, a porous jacket on said wheel, said jacket having an inner surface engaged with said rim and an outer surface exposed for engagement with said peripheral region of said workpiece, and a fluid delivery system for delivering a cleaning fluid from said inner surface to said outer surface.

15. The apparatus of claim 14 wherein said porous jacket includes a porous sponge material.

16. The apparatus of claim 14 wherein said means for delivering cleaning fluid comprises a fluid guiding passage coupled to an aperture in said rim, said passage having a distal end connected to a cleaning fluid source and a proximal end disposed for guiding cleaning fluid to said inner surface of said porous jacket.

17. The apparatus of claim 1 wherein said workpiece rotating means comprises a first wheel member disposed for engaging a peripheral region of said workpiece at a first engagement site, and a second wheel member disposed for engaging said peripheral region of said workpiece at a second engagement site circumferentially spaced from said first engagement site.

18. The apparatus of claim 17 further comprising means for changing said circumferential spacing between said first and second engagement sites.

19. The apparatus of claim 18 wherein said circumferential space changing means comprises angle changing means for changing an angle between a first radial line extending between said first engagement site and said third axis and a second radial line extending between said second engagement site and said third axis.

20. The apparatus of claim 19 wherein said angle changing means comprises a motor for generating a force, a coupling connected to said motor, a first arm having a distal end affixed to said first wheel member and a proximal end connected to said coupling, said coupling transforming said force generated by said motor to rotational motion of said first arm, and a second arm having a distal end affixed to said second wheel member and a proximal end affixed to said coupling, said coupling transforming said force generated by said motor to rotational motion of said second arm.

21. The apparatus of claim 1 wherein said workpiece rotating means comprises means for engaging a periphery of said workpiece at an engagement site.

22. The apparatus of claim 21 wherein said workpiece rotating means further comprises means for engaging said periphery at a second engagement site circumferentially spaced from said first engagement site.

23. The apparatus of claim 1 further comprising an elevation controller for controlling the draft of said workpiece relative to said first brush device.

24. The apparatus of claim 23 wherein said elevation controller comprises means for applying a controllable first force on said workpiece, means for applying a controllable second force on said workpiece, said second force being opposed to said first force, and means for concurrently operating said means for applying said first force and said means for applying said second force, thereby maintaining said draft.

25. The apparatus of claim 24 wherein said means for applying said first force comprises brush driving means for selectively rotating said first and second brush devices, and brush pressure means for exerting a selected pressure between said first and second brush devices and said first and second faces of said workpiece.

26. The apparatus of claim 24 wherein said means for applying said second force comprises a first wheel member for engaging said peripheral region of said workpiece at a first engagement site, and a second wheel member disposed for engaging a peripheral region of said workpiece at a second engagement site circumferentially spaced from said first engagement site.

27. The apparatus of claim 26 wherein said means for applying a said second force further comprises means for controlling said circumferential spacing between said first engagement site and said second engagement site.

28. The apparatus of claim 1 further comprising brush driving means for selectively rotating said first and second brush devices, and brush pressure means for exerting a selected pressure between said first and second brush devices and said first and second faces of said workpiece.

29. The apparatus of claim 28 wherein said brush driving means is configured to rotate said first brush device and said second brush device in opposite directions.

30. The apparatus of claim 28 wherein said brush driving means and said brush pressure means are configured to apply a controllable lifting force to said workpiece.

31. The apparatus of claim 1 further comprising a temperature controller for maintaining the temperature of said process liquid at a selected operating temperature.

32. The apparatus of claim 31 wherein said temperature controller is configured to maintain a selected operating temperature between 20 degrees Celsius and 60 degrees Celsius.

33. An apparatus for cleaning a vertically oriented workpiece having opposed first and second faces, said apparatus comprising a frame, support means mounted on said frame for supporting said vertically oriented workpiece in a process liquid, means for generating an acoustic wave in said process liquid, said acoustic wave generating means being coupled to said support means, rotating brush means mounted on said frame for brushing said first and second faces, and workpiece rotating means mourned on said frame and selectively engageable with said workpiece for rotating said workpiece while said brush means bushes said first and second faces.

* * * * *